United States Patent
Saboundji et al.

(10) Patent No.: US 12,006,577 B2
(45) Date of Patent: Jun. 11, 2024

(54) METHOD FOR PROTECTION AGAINST CORROSION

(71) Applicant: SAFRAN, Paris (FR)

(72) Inventors: Amar Saboundji, Moissy-Cramayel (FR); Luc Patrice Bianchi, Moissy-Cramayel (FR)

(73) Assignee: SAFRAN, Paris (FR)

( * ) Notice: Subject to any disclaimer, the term of this patent is extended or adjusted under 35 U.S.C. 154(b) by 325 days.

(21) Appl. No.: 17/614,145

(22) PCT Filed: May 26, 2020

(86) PCT No.: PCT/FR2020/050874
§ 371 (c)(1),
(2) Date: Nov. 24, 2021

(87) PCT Pub. No.: WO2020/240130
PCT Pub. Date: Dec. 3, 2020

(65) Prior Publication Data
US 2022/0251713 A1   Aug. 11, 2022

(30) Foreign Application Priority Data
May 27, 2019   (FR) ...................................... 1905569

(51) Int. Cl.
*C23C 28/00* (2006.01)
*C23C 4/11* (2016.01)
(Continued)

(52) U.S. Cl.
CPC ............ *C23C 28/3455* (2013.01); *C23C 4/11* (2016.01); *C23C 4/134* (2016.01); *C23C 14/024* (2013.01);
(Continued)

(58) Field of Classification Search
None
See application file for complete search history.

(56) References Cited

U.S. PATENT DOCUMENTS

| | | | |
|---|---|---|---|
| 2010/0080984 A1 | 4/2010 | Lee | |
| 2013/0224457 A1* | 8/2013 | Lee | .......................... C09D 1/02 427/248.1 |

FOREIGN PATENT DOCUMENTS

| | | |
|---|---|---|
| EP | 1 411 148 A1 | 4/2004 |
| EP | 1 526 111 A1 | 4/2005 |
| WO | 2017/212193 A1 | 12/2017 |

OTHER PUBLICATIONS

International Search Report dated Jul. 30, 2020, issued by the International Searching Authority in application No. PCT/FR2020/050874.

(Continued)

*Primary Examiner* — Shamim Ahmed
*Assistant Examiner* — Bradford M Gates
(74) *Attorney, Agent, or Firm* — Sughrue Mion, PLLC

(57) ABSTRACT

The present invention relates to a method for the protection of a hafnium-free, nickel-based monocrystalline superalloy part against corrosion and oxidation. The method comprises at least the following steps of: manufacturing a hafnium-free, nickel-based monocrystalline superalloy part (1), depositing on the part a first hafnium-free sublayer (2), depositing, on the first sublayer (2), a second hafnium-doped sublayer (3), depositing, on the second sublayer (3), a third hafnium-free sublayer (4), sandblasting the third sublayer (4) to at least partially separate the third sublayer (4) and increase the surface roughness of an upper sub-layer formed by the second sublayer (3) and at least partially by the third sublayer (4), performing oxidation treatment so as to obtain (Continued)

at the surface a layer of hafnium-doped oxidised material (5), depositing a thermal barrier layer (6) on the layer of oxidised material (5).

12 Claims, 2 Drawing Sheets

(51) Int. Cl.
*C23C 4/134* (2016.01)
*C23C 14/02* (2006.01)
*C23C 14/34* (2006.01)

(52) U.S. Cl.
CPC ............ *C23C 14/028* (2013.01); *C23C 14/34* (2013.01); *C23C 28/3215* (2013.01)

(56) References Cited

OTHER PUBLICATIONS

Search Report dated Jan. 20, 2020, issued by the French Patent Office in application No. FR 1905569.

\* cited by examiner

METHOD FOR PROTECTION AGAINST CORROSION

CROSS REFERENCE TO RELATED APPLICATIONS

This application is a National Stage of International Application No. PCT/FR2020/050874 filed May 26, 2020, claiming priority based on French Patent Application No. 1905569 filed May 27, 2019, the entire contents of each of which being herein incorporated by reference in their entireties.

FIELD OF THE INVENTION

The invention relates to the field of superalloy component manufacture, and more particularly to the thermal barrier protection of superalloy components.

STATE OF THE ART

A superalloy or high-performance alloy is a metal alloy with excellent strength and creep resistance at high temperature (typically 0.7 to 0.8 times its melting temperature), good surface stability and good corrosion and oxidation resistance. Superalloys typically have a face-centered cubic crystal structure of the austenitic type. The alloying elements on which a superalloy is based are most often nickel, cobalt and iron, but also titanium and aluminum.

For superalloy corrosion and oxidation resistance, it is known to form a so-called thermal barrier assembly, consisting of a substrate (the superalloy component to be protected), a bond coat and a thermal barrier on the bond coat.

The composition and quality of the metal layer (known as the bond coat) play a fundamental role in the in-service behavior of a thermal barrier assembly.

State of the art components that comprise successively, from the inside to the outside, a nickel-based single-crystal superalloy substrate, a bond coat and a thermal barrier, are already known.

It is well known that adding hafnium to a thermal barrier assembly significantly improves the adhesion of the thermal barrier.

There are several known solutions for adding hafnium to a thermal barrier system.

A first technique consists in adding a large amount of hafnium directly into the substrate (if the amount is too small, the hafnium does not diffuse sufficiently into the bond coat), i.e., during the development stage of the superalloy constituting this substrate. However, this makes the solution treatment of this superalloy more difficult. Indeed, superalloys undergo a heat treatment, comprising a solution phase and tempering phases. Such treatments consist in heating the alloy to a suitable temperature, below the eutectic temperature, and holding this temperature long enough to homogenize the elemental concentrations of its constituents and control the size of the intermetallic precipitates. This optimizes the microstructural properties of the material.

However, the presence of hafnium in the superalloy makes it more difficult to bring the eutectics into total or near-total solution and leads to burning defects. Nevertheless, this first technique improves the oxidation resistance of the component thus obtained.

A second technique consists in adding a small amount of hafnium to the bond coat during deposition of the latter. However, this technique only improves the adhesion of the thermal barrier in the case of a physical vapor deposition (PVD) sputtering method and does not work in the case of a thermal spray deposition method such as suspension plasma spraying (SPS), which requires sandblasting to achieve a rough surface finish. However, sandblasting removes material from the bond coat which, in this case, reduces the amount of hafnium.

A third technique consists in adding a large amount of hafnium to the bond coat during deposition of the latter so that enough hafnium remains to improve the adhesion of the thermal barrier in the case of SPS deposition. On the other hand, this solution degrades the protection of the superalloys against corrosion and oxidation. Furthermore, in the case of platinum-free or low-platinum bond coats, the addition of hafnium to the bond coat degrades the oxidation resistance of the system.

In this context, the objective of the invention is therefore to overcome the above-mentioned drawbacks of the state of the art.

In particular, the objective of the invention is to provide a process for improving the adhesion and the service life of the thermal barrier deposited by SPS, CVD or PVD on a bond coat, without degrading the corrosion and oxidation resistance of the component.

DISCLOSURE OF THE INVENTION

According to a first aspect, the invention relates to a process for protecting a hafnium-free nickel-based single-crystal superalloy component against corrosion and oxidation, which comprises at least the following steps consisting in:

manufacturing a hafnium-free nickel-based single-crystal superalloy component, depositing a first hafnium-free bond coat on said component, depositing a second hafnium-doped bond coat on said first bond coat, depositing a third hafnium-free bond coat on said second bond coat, stripping said third bond coat by sandblasting to at least partially remove said third bond coat and increase the surface roughness of an upper bond coat formed by said second bond coat and at least partially by the third bond coat, carrying out an oxidation treatment so as to obtain a layer of hafnium-doped oxidized material on the surface, depositing a thermal barrier layer on said layer of oxidized material.

Thus, the invention advantageously proposes the use of a third bond coat intended to act as a screen during the stripping process—by sandblasting—in order to preserve the integrity of the second hafnium-doped bond coat, and thus to conserve the amount of hafnium deposited. In other words, sandblasting is a necessary preliminary step to thermal spraying of the thermal barrier. But blasting tears off material. Therefore, the use of a third bond coat, free of hafnium and intended to be stripped off during sandblasting, protects the second hafnium-doped bond coat. Thus, contrary to known processes, the hafnium-doped bond coat is not or only slightly stripped off by the sandblasting and thus retains the amount of hafnium that has been integrated into it.

Thus, this arrangement allows the thermal barrier to be deposited by SPS thermal spraying (a process for which sandblasting is necessary) while holding the chosen mass percentage of hafnium so as to promote the durability of the thermal barrier and extend its service life, while promoting the corrosion and oxidation resistance of the superalloy component.

Said thermal barrier layer may be deposited by thermal spraying according to a suspension plasma spraying method.

Said thermal barrier layer may be deposited according to a PVD method, preferably by sputtering.

The third bond coat can be completely stripped off during stripping by sandblasting.

The mass percentage of hafnium in the second bond coat may correspond to a predetermined value.

The mass percentage of hafnium in the second bond coat can be determined as follows:

$$C3 = Cmean \frac{V2 + V3 + V4}{V3}$$

with V2 the volume of the first bond coat, V3 the volume of the second bond coat and V4 the volume of the third bond coat, and Cmean the mean mass percentage of hafnium in the component.

The oxidation treatment of said second bond coat can be carried out by a heat treatment under partial pressure of oxygen or argon, this heat treatment which may comprise a phase of increasing the temperature until a temperature comprised between 900° C. and 1200° C. is reached, a phase of holding this temperature for less than one hour and a phase of cooling until room temperature is reached.

The first bond coat and/or the third bond coat consists of an alloy selected from NiPtAl or MCrAlX, with M equal to cobalt, nickel, or cobalt-nickel, and with X equal to yttrium or silicon.

The second bond coat may consist of an alloy selected from AlHf or MCrAlYHf, with M equal to cobalt, nickel, or cobalt-nickel.

The third bond coat may consist of an alloy selected from NiPtAl or MCrAlX, with M equal to cobalt, nickel, or cobalt-nickel, and with X equal to yttrium or silicon.

All the deposition steps can be performed by the same deposition device.

According to a second aspect, the invention relates to a hafnium-free nickel-based single-crystal superalloy component, protected against corrosion by a process according to the invention, with V2 the volume of the first bond coat, V3 the volume of the second bond coat, V4 the volume of the third bond coat, and Cmean the mean mass percentage of hafnium in the component.

The oxidation treatment of said second bond coat can be carried out by a heat treatment under partial pressure of oxygen or argon, this heat treatment which may comprise a phase of increasing the temperature until a temperature comprised between 900° C. and 1200° C. is reached, a phase of holding this temperature for less than one hour and a phase of cooling until room temperature is reached.

The first bond coat and/or the third bond coat consists of an alloy selected from NiPtAl or MCrAlX, with M equal to cobalt, nickel, or cobalt-nickel, and with X equal to yttrium or silicon.

The second bond coat may consist of an alloy selected from AlHf or MCrAlYHf, with M equal to cobalt, nickel, or cobalt-nickel.

The third bond coat may consist of an alloy selected from NiPtAl or MCrAlX, with M equal to cobalt, nickel, or cobalt-nickel, and with X equal to yttrium or silicon.

All the deposition steps can be performed by the same deposition device.

According to a second aspect, the invention relates to a hafnium-free nickel-based single-crystal superalloy component, protected against corrosion by a process according to the invention.

DESCRIPTION OF THE FIGURES

Other features, aims and advantages of the invention will emerge from the following description, which is purely illustrative and non-limiting, and which should be read in conjunction with the appended drawings in which.

Throughout the figures, similar elements have identical reference marks.

DETAILED DESCRIPTION OF THE INVENTION

According to one aspect, the invention relates to a process for protecting a hafnium-free nickel-based single-crystal superalloy component against corrosion and oxidation. The process comprises at least the following steps consisting in:

- manufacturing a hafnium-free nickel-based single-crystal superalloy component,
- depositing a first hafnium-free bond coat on said component,
- depositing a second hafnium-doped bond coat on said first bond coat,
- depositing a third hafnium-free bond coat on said second bond coat,
- stripping said third bond coat by sandblasting to at least partially remove said third bond coat and increase the surface roughness of said second bond coat,
- carrying out an oxidation treatment so as to obtain a layer of hafnium-doped oxidized material,
- depositing a thermal barrier layer on said layer of oxidized material.

Manufacture of the Superalloy Component

Figure 1:
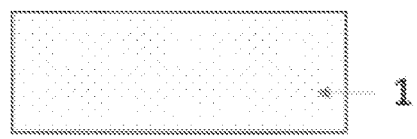
FIG. 1 shows a first step of the process according to the invention.

As shown in FIG. 1, a first step of the process may consist in manufacturing a hafnium-free nickel-based single-crystal superalloy component 1.

The component 1 can, for example, be obtained by casting or additive manufacturing and has the desired shape.

Table 1 below shows several examples of superalloys that can be used in the process according to the invention. They are identified by the letters A to F.

TABLE 1

| | Alloying elements (mass percentages) | | | | | | | | | |
|---|---|---|---|---|---|---|---|---|---|---|
| | Ni | Al | Co | Cr | Mo | Re | Ta | Ti | W | Cb | Ru |
| A | Remainder | 5.2 | 6.5 | 7.8 | 2 | 0 | 7.9 | 1.1 | 5.7 | | |
| B | Remainder | 5.6 | 9.6 | 6.5 | 0.6 | 3 | 6.5 | 1 | 6 | | |
| C | Remainder | 5.73 | 9.6 | 3.46 | 0.6 | 4.87 | 8.28 | 0.86 | 5.5 | | |
| D | Remainder | 5.7 | 3 | 2 | 0.4 | 6 | 8 | 0.2 | 5 | 0.1 | |
| E | Remainder | 5.8 | 12.5 | 4.2 | 1.4 | 5.4 | 7.2 | 0 | 6 | | |
| F | Remainder | 6 | <0.2 | 4 | 1 | 4 | 5 | 0.5 | 5 | | 4 |

Examples of hafnium-free nickel-based single-crystal superalloys

The term "remainder" corresponds, for each superalloy, to the residual mass percentage to reach 100% with the various other components mentioned.

Deposition of the First Bond Coat

Figure 2:
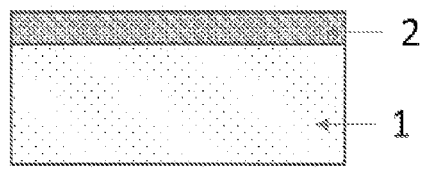
FIG. 2 shows a second step of the process according to the invention.

The second step of the process is shown in FIG. 2. This step consists in depositing a first hafnium-free bond coat 2. This first bond coat 2 will serve to limit the diffusion of the hafnium present in the second bond coat 3 into the component 1.

The first bond coat 2 may consist of an alloy selected from NiPtAl or MCrAlX, with M equal to cobalt, nickel, or cobalt-nickel, and with X equal to yttrium or silicon.

The first bond coat can have a thickness comprised between 5 μm and 50 μm.

The first bond coat 2 can be deposited by physical vapor deposition (PVD) or, preferentially, by chemical vapor deposition (CVD).

Deposition of the Second Bond Coat

Figure 3:
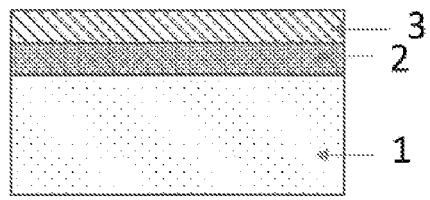
FIG. 3 shows a third step of the process according to the invention.

The third step, shown in FIG. 3, corresponds to the deposition of the second bond coat 3. In a particularly advantageous manner, the second bond coat 3 is doped with hafnium.

The second bond coat 3 may consist of an alloy selected from AlHf or MCrAlYHf, with M equal to cobalt, nickel, or cobalt-nickel.

Moreover, the (atomic) hafnium mass percentage C3 of the second bond coat 3 is calculated in relation to the volume of all the bond coats, as a function of the mean mass percentage Cmean of hafnium in the component, according to:

$$Cmean = \frac{C2V2 + C3V3 + C4V4}{V2 + V3 + V4}$$

With: C2 the mass percentage of hafnium in the first bond coat 2, V2 the volume of the first bond coat 2, V3 the volume of the second bond coat 3, C4 the mass percentage of hafnium in the third bond coat 4 and V4 the volume of the third bond coat 4.

Preferably, C2 and C4 are zero, therefore:

$$Cmean = \frac{C3V3}{V2 + V3 + V4}$$

Which is the same as writing:

$$C3 = Cmean \frac{V2 + V3 + V4}{V3}$$

In a particularly preferred manner, the third bond coat 4 is completely stripped off during stripping and the first bond coat 2 and the second bond coat 3 have an identical volume. This means that, in this case where V4=0 and V2=V3, then: C3=2*Cmean=1%.

This means that the mean mass percentage of hafnium in the component Cmean is 0.5%.

In a particularly advantageous manner, the hafnium present in the second bond coat 3 reinforces the grain boundaries of the second bond coat 3, thus blocking the diffusion of metal cations and slowing the diffusion of oxygen into the second bond coat 3 and thus the oxidation kinetics of the second bond coat 3.

The second bond coat can be deposited by physical vapor deposition (PVD) or, preferentially, by chemical vapor deposition (CVD).

Deposition of the Third Bond Coat

Figure 4:
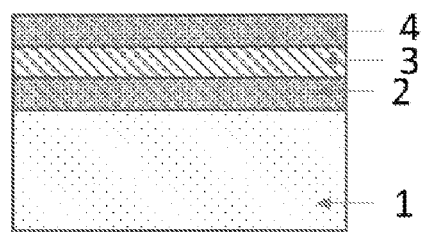
FIG. 4 shows a fourth step of the process according to the invention.

The fourth step of the process, shown in FIG. 4, corresponds to the deposition of a third hafnium-free bond coat 4.

The third bond coat 4 is a particularly advantageous provision of the invention. Indeed, as will be described hereinafter, this bond coat is intended to be stripped, and thus mostly stripped off, during a sandblasting step, but its presence preserves the second bond coat 3 to the greatest extent possible during sandblasting (and thus preserves a maximum of hafnium).

The third bond coat 4 may consist of the same alloy as the first bond coat 2.

Thus, the third bond coat 4 may consist of an alloy selected from NiPtAl or MCrAlX, with M equal to cobalt, nickel, or cobalt-nickel, and with X equal to yttrium or silicon.

As with the preceding bond coats, the third bond coat 4 can be deposited by a PVD or, preferentially, CVD process.

It is noteworthy that, in a particularly advantageous manner, the three bond coats can be sprayed by the same deposition device. This arrangement makes it possible to simplify the process according to the invention (compared with the processes of the prior art).

Sandblasting

The fifth step of the process is a stripping step by sandblasting of the third bond coat 4. Sandblasting is used to prepare the deposition of the thermal barrier by thermal spraying of the suspension plasma spraying (SPS) type, in particular by increasing the roughness of the surface on which the thermal spraying is to be performed.

Figure 5:
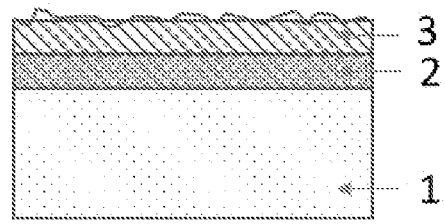
FIG. 5 shows a fifth step of the process according to the invention.

In a particularly advantageous manner, by carrying out the sandblasting on the third bond coat 4, which will be completely or partially stripped off, the second bond coat 3 is preserved. Thus, at the end of the sandblasting, the outer layer is either the second bond coat 3 again (as shown in FIG. 5) or a residual fraction of the third bond coat 4, but with a modified surface finish (the surface roughness of said second or third flush bond coat 3, 4 is increased), and it still has, substantially, the desired mass percentage of hafnium C3.

In the remainder of this description, the second or third bond coat 3, 4, which is flush and has a modified surface finish, as obtained after at least partial stripping of the third bond coat 4, will be referred to as the "upper" bond coat. More precisely, if the third bond coat 4 is almost completely stripped, the upper bond coat is the second bond coat 2, and otherwise it is always the third bond coat 4, at least what remains of it.

Oxidation

Figure 6:
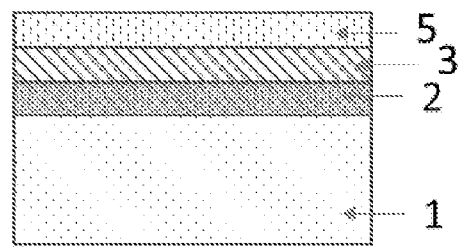
FIG. 6 shows a sixth step of the process according to the invention.

The sixth step of the process is a step of surface oxidation, i.e., of the upper bond coat, so as to obtain a layer of hafnium-doped oxidized material 5. More precisely, a surface portion of the upper bond coat undergoes oxidation so that the material of that surface portion is transformed (it is oxidized). The oxidation treatment, shown in FIG. 6, produces a layer of hafnium-doped oxidized material 5. More precisely, in a preferential manner, it is a layer of aluminum oxide (Al2O3, also called alumina) comprising hafnium in its grain boundaries, in other words a layer of aluminum oxide doped at the level of its grain boundaries by hafnium. This oxidation treatment is carried out inside an enclosure under partial pressure of oxygen or argon.

The various steps of the oxidation treatment are preferably as follows:
temperature increase: preferably 80° C. to 100° C./min,
oxidation time: 0.5 h to 1 h, at a temperature comprised between 900° C. and 1200° C.,
cooling, temperature decrease: preferably 80° C. to 100° C./min.

Deposition of the Thermal Barrier

Figure 7:
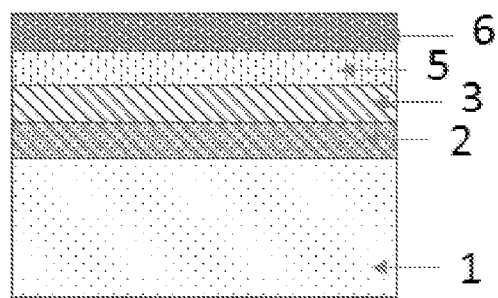
FIG. 7 shows a seventh step of the process according to the invention.

Finally, the last step of the process, shown in FIG. 7, is a step of depositing the thermal barrier 6. Preferentially, the thermal barrier 6 is deposited using an SPS thermal spray method.

It is noteworthy that the thermal barrier is deposited directly on the layer of oxidized material 5. Thus, the hafnium present in the second bond coat 3 and in the layer of oxidized material 5 can diffuse into the thermal barrier so as to extend its service life.

The invention claimed is:

1. A process for protecting a hafnium-free nickel-based single-crystal superalloy component against corrosion and oxidation, wherein the process comprises:
manufacturing a hafnium-free nickel-based single-crystal superalloy component,
depositing a first hafnium-free bond coat on the component,
depositing a second hafnium-doped bond coat on the first bond coat,
depositing a third hafnium-free bond coat on the second bond coat,
stripping the third bond coat by sandblasting to at least partially remove the third bond coat and increase a surface roughness of an upper bond coat formed by the second bond coat or formed by the second bond coat and by a remaining part of the third bond coat obtained after the sandblasting,
carrying out an oxidation treatment so as to obtain a layer of hafnium-doped oxidized material on a surface of the upper bond coat, and
depositing a thermal barrier layer on the layer of hafnium-doped oxidized material.

2. The process as claimed in claim 1, wherein the thermal barrier layer is deposited by thermal spraying according to a suspension plasma spraying method.

3. The process as claimed in claim 1, wherein the thermal barrier layer is deposited according to a physical vapor deposition PVD method.

4. The process as claimed in claim 1, wherein the third bond coat is completely stripped off during stripping by sandblasting and the upper bond coat is formed by the second bond coat.

5. The process as claimed in claim 1, wherein the mass percentage of hafnium C3 in the second bond coat corresponds to a predetermined value as a function of a mean mass percentage of hafnium in the component expected.

6. The process as claimed in claim 5, wherein the mass percentage C3 of hafnium in the second bond coat is determined as follows:

$$C3 = Cmean\frac{V2 + V3 + V4}{V3}$$

with V2 the volume of the first bond coat, V3 the volume of the second bond coat and V4 the volume of the third bond coat, and Cmean the mean mass percentage of hafnium in the three bond coats.

7. The process as claimed in claim 1, wherein the oxidation treatment is carried out by a heat treatment under partial pressure of oxygen or argon, the heat treatment comprising a phase of increasing the temperature until a temperature comprised between 900° C. and 1200° C. is reached, a phase of holding this temperature for less than one hour and a phase of cooling until room temperature is reached.

8. The process as claimed in claim 1, wherein the first bond coat and/or the third bond coat consists of an alloy selected from NiPtAl or MCrAlX, with M equal to cobalt, nickel, or cobalt-nickel, and with X equal to yttrium or silicon.

9. The process as claimed in claim 1, wherein the second bond coat consists of an alloy selected from AlHf or MCrAlYHf, with M equal to cobalt, nickel, or cobalt-nickel.

10. The process as claimed in claim 1, wherein the third bond coat consists of an alloy selected from NiPtAl or MCrAlX, with M equal to cobalt, nickel, or cobalt-nickel, and with X equal to yttrium or silicon.

11. The process as claimed in claim 1, wherein all the deposition steps are performed by the same deposition device.

12. The process as claimed in claim 1, wherein the thermal barrier layer is deposited by sputtering.

* * * * *